(12) United States Patent
Sasada et al.

(10) Patent No.: US 6,229,423 B1
(45) Date of Patent: May 8, 2001

(54) OPEN-ENDED CYLINDRICAL TYPE MAGNETIC SHIELD APPARATUS

(75) Inventors: Ichiro Sasada, Fukuoka; Eugene Paperno, Oonojou; Hiromi Naka, Kasuga, all of (JP)

(73) Assignee: Kyushu University, Fukuoka (JP)

( * ) Notice: Subject to any disclaimer, the term of this patent is extended or adjusted under 35 U.S.C. 154(b) by 0 days.

(21) Appl. No.: 09/434,459

(22) Filed: Nov. 5, 1999

(30) Foreign Application Priority Data

May 10, 1999 (JP) .................................................. 11-129225

(51) Int. Cl.$^7$ ....................................................... H01F 7/00
(52) U.S. Cl. ................................................................ 335/301
(58) Field of Search ..................................... 335/301, 304, 335/214; 174/32, 35 R, 35 CE, 35 MS; 206/719–721; 307/91

(56) References Cited

U.S. PATENT DOCUMENTS 3,777,255 * 12/1973 Young et al. .......................... 324/40

FOREIGN PATENT DOCUMENTS 3-66839    10/1991 (JP) .

OTHER PUBLICATIONS

A. Mager, Magnetic Shields, IEEE Trans. Magnetics, vol. 6, No. 1, pp. 67–75, Mar. 1970.*

* cited by examiner

Primary Examiner—Ray Barrera
(74) Attorney, Agent, or Firm—Oliff & Berridge, PLC

(57) ABSTRACT

The magnetic shield device including a plurality of concentrically arranged open-ended cylinders having a magnetic shaking applied thereto. A rectangular magnetic ribbon is fixed on the innermost cylinder such that a longitudinal direction of the ribbon is in parallel with or substantially in parallel with a circumferential direction of the cylinder to obtain a large magnetic shielding enhancement on a transverse direction, and a coil is wound around the innermost cylinder for supplying a magnetic shaking current. A rectangular magnetic ribbon is fixed on at least one cylinder except for the innermost one such that a longitudinal direction of the ribbon is in parallel with or substantially in parallel with an axial direction of the cylinder to obtain a large magnetic shielding enhancement on the axial direction, and a coil is wound around the cylinder for supplying a magnetic shaking current. A leakage of the magnetic shaking fields can be minimized and a high magnetic shielding enhancement on both the axial and circumferential directions can be attained. At least one cylinder is made of a magnetic material, and axial length and diameter of cylinders are suitably adjusted to attain a uniformity of a leakage magnetic field within the cylinder can be improved while a sufficiently high shielding factor is remained.

14 Claims, 7 Drawing Sheets

OPEN-ENDED CYLINDRICAL TYPE MAGNETIC SHIELD APPARATUS

BACKGROUND OF THE INVENTION

1. Field of the Invention

The present invention generally relates to a magnetic shield device comprising at least one cylinder whose both ends are opened, a space within said at least one cylinder being shielded from ambient magnetic fields.

The present invention relates more particularly to a magnetic shield device comprising an open-ended cylinder made of a non-magnetic material, a ribbon which is made of a magnetic material having a rectangular hysteresis loop and is wound and fixed around the cylinder, and a coil wound around the cylinder, wherein by conducting a magnetic shaking current to the coil, an inner space of the cylinder is free from external magnetic fields.

Furthermore, the invention relates to a magnetic shield device comprising one or more open-ended cylinders arranged concentrically, said cylinder or cylinders being suitably configured to construct, therein, a space which is free from external magnetic fields.

2. Description of the Related Art

In many applications, it is required to measure a small change of a magnetic field without being affected by external magnetic fields. In usual magnetic field measurement, biological magnetic field measurement, particularly brain magnetic field measurement, and precise physical measurement, a space free from environmental magnetic noise such as geomagnetic noise and environment magnetic noise is required for measuring a weak magnetic field measurements as well as for evaluating a performance of a precise flux meter.

Heretofore, a magnetic shield device having a space completely covered with a magnetic material has been widely used. However, since the space is completely covered, working performance is low, and there is a problem that an arrangement of a substance within the space could not be known accurately.

In order to solve such problems, there has been proposed an open-ended cylindrical magnetic shield device, in which a ribbon made of a magnetic material having a rectangular hysteresis loop is fixed on an outer surface of an open-ended cylinder made of a non-magnetic material or PERIMALLOY, which is a trademark used for any of several alloys of nickel and iron having high magnetic permeability. Such an open-ended cylindrical magnetic shield has a simple structure, and has been used to measure a weak magnetic field. The magnetic shield has been designed to attain a high shielding factor S, which is represented by a ratio of a ambient magnetic field intensity $H_0$ to a leaked magnetic field intensity $H_1$ within the shield ($S=H_0/H_1$).

One of the inventors of present invention suggested, in Japanese Patent Application Kokai Hei 3-66839, a magnetic shield device, in which a ribbon made of a magnetic material with a rectangular hysteresis loop is wound and fixed around an outer surface of the open-ended cylinder, i.e. shell, a coil is wound around the cylinder, and a magnetic shaking current in a frequency range from 150 Hz to 10 KHz is supplied to the coil.

In such an open-ended cylindrical shield device, there has been proposed to make the cylinder of a non-magnetic material such as aluminum or copper, and a ribbon made of a magnetic material such as Metglass 2705M (trademark of Allied Corp. in USA) with a rectangular hysteresis loop is wound helically, i.e. in a solenoid-shape around the open-ended cylinder. A magnetic shaking enhancement is generated by supplying a current to the coil wound toroidally around the cylinder.

In this magnetic shield device, it is possible to attain the shielding factor S more than 100 by using a small amount of magnetic material, but recently a higher shielding factor S is required. However such a high shielding factor S could not be obtained by using this structure. According to the publication mentioned. It has been proposed in the above mentioned Patent Publication to increase the number of winding layers of magnetic ribbon, and to arrange a plurality of cylinders concentrically.

In addition, in the magnetic shield device mentioned in the above Patent Publication, the ribbon made of a magnetic material with a rectangular hysteresis loop is wound and fixed helically, i.e. in a solenoid-shape around the cylinder. Therefore, there is a problem that this structure could generate a high magnetic shaking enhancements on the lateral, i.e. transverse direction, but extremely low on the axial direction.

On the other hand, the open-ended cylindrical magnetic shield device consisting of a PERMALLOY has been also proposed. Upon designing such a magnetic shield device, it has been mainly aimed to increase the shielding factor S as explained above, but has not been aimed to make a residual magnetic field within the shell to be uniform. Thus in the magnetic shield device employing the open-ended cylinder, not only the shielding factor S but also the uniformity of residual magnetic field are important characteristics.

For instance, in the measurement of an extremely weak magnetic field such as the brain magnetic field, a first order differential type pick-up (called gradiometer) has been widely used, because an effect of the uniform residual magnetic field could be cancelled out. If the residual magnetic field within the shell has a gradient, the pick-up might respond to such a gradient, and the magnetic field could not be precisely measured. Under such a circumstance, it has been desired to develop a magnetic shield device comprising both ends opened cylinder or cylinders, in which a high shielding factor could be attained and a residual magnetic filed within the shield device has an excellent uniformity.

SUMMARY OF THE INVENTION

The present invention has for its object to provide an open-ended cylindrical magnetic shield device including a plurality of cylinders whose both ends are open such that exact and easy operation can be performed, in which a leakage of the magnetic shaking field can be prevented, a large magnetic shielding enhancement can be obtained not only on the transverse direction but also on the axial direction, and therefore a shielding factor S can be increased.

It is another object of the invention to provide a magnetic shields device comprising a single open-ended cylinder or a plurality of open-ended cylinders made of a magnetic material, in which a sufficiently large shielding factor can be attained and a residual magnetic field within the shield can be uniform, and thus the shield device is specifically advantageous to be applied to a biomagnetic measurement which requires a precise measurement of a particularly weak magnetic fielded.

According to a first aspect of the present invention, an open-ended cylindrical magnetic shield including at least two open-ended cylinders which are arranged concentrically, a magnetic shaking being applied to each of said cylinders wherein;

a ribbon made of a magnetic material having a rectangular hysteresis loop is fixed on an innermost cylinder such that a longitudinal direction of the ribbon is in parallel with or substantially in parallel with a circumferential direction of the cylinder to obtain a large magnetic shielding enhancement on a transverse direction;

a coil is wound around the innermost cylinder, a magnetic shaking current being supplied to said coil;

a ribbon made of a magnetic material having a rectangular hysteresis loop is fixed on at least one cylinder other than said innermost cylinder such that a longitudinal direction of the ribbon is in parallel with or substantially in parallel with an axial direction of the cylinder such that a large magnetic shielding enhancement is obtained on the axial direction; and a coil is wound around said at least one cylinder, a magnetic shaking current being supplied to said at least one cylinder.

In the magnetic shield device according to the first aspect of the invention, the large magnetic shielding enhancement can be attained for external magnetic fields from all directions, and an extremely high shielding factor S can be obtained by a combination of the cylinder having a structure (which is designated as a circumferential structure), in which the ribbon made of a magnetic material with a rectangular hysteresis loop is fixed such that the longitudinal direction of the ribbon is in parallel with or substantially in parallel with the circumferential direction of the cylinder to obtain a large magnetic shielding enhancement on the transverse direction, and of the cylinder having a structure (which is referred to an axial structure), in which the ribbon made of a magnetic material with a rectangular hysteresis loop is fixed such that the longitudinal direction of the ribbon is in parallel with or substantially in parallel with the axial direction of the cylinder to obtain a large magnetic shielding enhancement on the axial direction. In addition, since at least the innermost cylinder is configured as the circumferential structure, in which the ribbon made of a magnetic material with a rectangular hysteresis loop is fixed such that the longitudinal direction of the ribbon is in parallel with or substantially in parallel with the circumferential direction of the cylinder. The problem of leakage of the shaking magnetic field could be mitigated, because an amount of the magnetic shaking current for such a circumferential structure is about 1/10 of that for the axial structure, in which the ribbon made of a magnetic material with a rectangular hysteresis loop is fixed such that the longitudinal direction of the ribbon is in parallel with or substantially in parallel with the axial direction of the cylinder.

Furthermore, when even a small leakage of the shaking magnetic field toward the inside of the innermost cylinder is undesired, a cylinder having no magnetic shaking applied thereto may be concentrically arranged within the innermost cylinder, said cylinder being made of a PERMALLOY or being formed by a non-magnetic cylinder having an amorphous magnetic ribbon fixed thereon. In this case, a space with an extremely small residual magnetic field can be attained within the cylinder to which the magnetic shaking is not applied.

Moreover, in the circumferential structure in which the ribbon made of a magnetic material with a rectangular hysteresis loop is fixed such that the longitudinal direction of the ribbon is substantially in parallel with the circumferential direction of the cylinder, an inclination angle of the ribbon with respect to the circumferential direction may be smaller than or equal to 40 degrees. In the axial structure in which the ribbon made of a magnetic material with a rectangular hysteresis loop is fixed such that the longitudinal direction of the ribbon is substantially in parallel with the axial direction of the cylinder, an inclination angle of the ribbon with respect to the axial direction may be not larger than 40 degrees.

In an embodiment of the magnetic shield device according to the first aspect of the present invention, three cylinders, that is first, second and third cylinders having the magnetic shaking applied thereto, are arranged concentrically, a ribbon made of an amorphous magnetic material with a rectangular hysteresis loop is wound on the third innermost cylinder such that the longitudinal direction of the ribbon is substantially in parallel with or in parallel with the circumference direction of the cylinder, and a ribbon made of an amorphous magnetic material with a rectangular hysteresis loop is fixed on each of the first and second cylinders arranged outside of the first cylinder such that the longitudinal direction of the ribbon is substantially in parallel with or in parallel with the axial direction of the cylinder. These amorphous magnetic material ribbons may be made of Metglass 2705M.

The coils to which the magnetic shaking currents are supplied may be wound toroidally or helically. Since the toroidal coil has a function of closing a magnetic field therein, the coil is preferably wound toroidally.

According to the invention, the cylinder, on which the ribbon made of a magnetic material with a rectangular hysteresis loop is wound, serves as a frame, and thus the cylinder is preferably made of an electrically insulating material having a high mechanical strength. Any non-magnetic material may be used to construct the cylinder as long as the cylinder can be used as a frame. In particular, the cylinder is preferably made of hard plastics or glass epoxy resin.

According to a second aspect of the present invention, an open-ended cylindrical magnetic shield device comprising a single open-ended cylinder made of a magnetic material, said cylinder being constructed to satisfy the following equation:

$$L/D=1+\log(\mu t/D)+C$$

wherein L is an axial length, D is a diameter and t is a thickness of the cylinder, $\mu$ is a relative permeability of the magnetic material of the cylinder, and C is a constant within a range from 0.5 to 1.2.

In the magnetic shield device according to the second aspect of the invention, by designing a relation between the length L and the diameter D of the cylinder to satisfy the above equation, a residual magnetic field within the shield can be uniform, while the shielding ratio can be kept to a sufficient high value. That is to say, the magnetic field entering into the cylinder from the open-ends is dense on the an axial line and becomes less dense toward the inner wall of the cylinder, whilst the magnetic field entering into the cylinder through the cylinder wall is dense on the wall and becomes less dense toward the axial line of the cylinder. In this manner, a distribution viewed in the radial direction of the magnetic field entering from the open-ends becomes opposite to that of the magnetic field entering through the cylinder wall, and furthermore the longer the axial length L is, the more the magnetic field which is leaked into the cylinder through the wall. Therefore, by suitably setting the ratio between axial length L and diameter D of the cylinder, the residual magnetic field within the shield can be uniform viewed in the transverse direction of the cylinder.

In addition, by limiting the value of the constant C, in the above equation, to a value within the range of 0.5 to 1.2, a deviation from L/D=1+log($\mu$t/D)+C, in which the maximum shielding factor can be obtained, can be suppressed. Thus the shielding factor could be maintained sufficiently high. In the present invention, the constant C is limited within the range of 0.5 to 1.2 owing to the reason that, if C is less than 0.5, the shielding factor approaches the maximum value, but the uniformity of the residual magnetic field within the shield could not be obtained, and if C is larger than 1.2, the shielding factor becomes too small and also the uniformity of the residual magnetic field in the shield is decreased. Furthermore, in the second aspect of the invention, said constant C is preferably set to a value within a range of 0.75 to 1.0.

According to a third aspect of the invention, a magnetic shield device including a plurality of open-ended cylinders made of magnetic materials and arranged concentrically, length L and diameter D of these cylinders being set such that the cylinders are divided into first and second groups in which a sign of axial and/or radial gradients of magnetic fields within one or more cylinders belonging to the first group is opposite to a sign of axial and/or radial gradients of magnetic fields within one or more cylinders belonging to the second group, and a magnitude of a gradient of composed magnetic fields in the first group becomes substantially identical with a magnitude of a gradient of composed magnetic fields in the second group.

In the magnetic shield device according to the third aspect of the invention, by combining one or more cylinders having positive gradients of magnetic fields with one or more cylinders having negative gradients of magnetic fields such that a positive gradient of a composite magnetic fields becomes substantially identical with a negative gradient of a composite magnetic fields, and therefore the positive and negative gradients are cancelled out and a total gradient within the cylinders can be substantially zero. In the third aspect of the invention, respective cylinders have smaller shielding factors which are slightly smaller than those of the above mentioned second aspect of the invention, but a total shielding factor can be made high, because the total shielding factor is in proportion to a product of the shielding factors of respective cylinders. Therefore, by suitably combining a plurality of cylinders in accordance with respective applications, a gradient of a residual magnetic field in the transverse or the axial direction, or a gradient in both the transverse and axial directions can be substantially zero, while the sufficiently high shielding factor can be maintained.

DETAILED DESCRIPTION OF PREFERRED EMBODIMENTS

Figure 1:
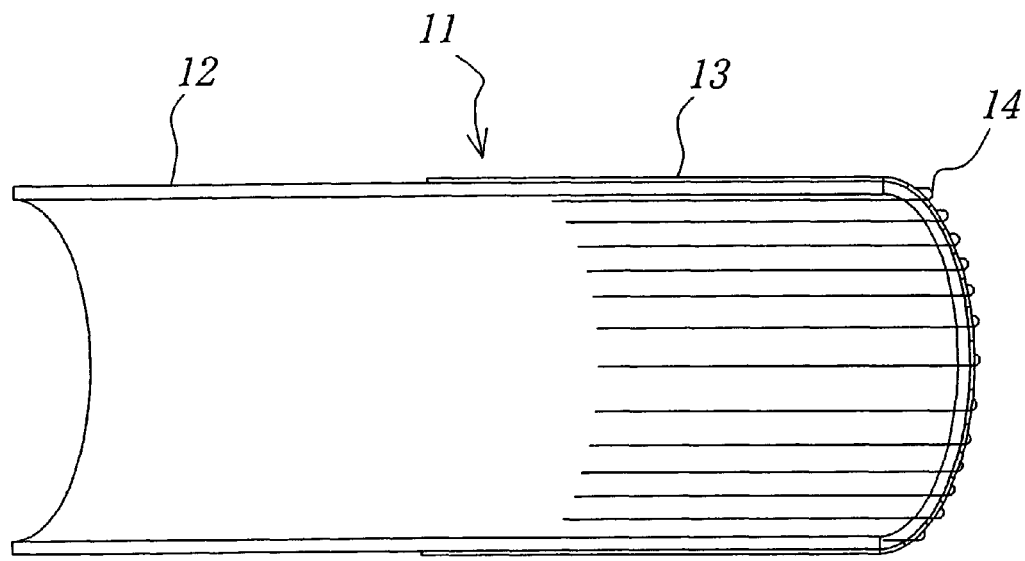
FIG. 1 is a schematic diagram showing the configuration of an outermost cylinder used in an embodiment of the open-ended cylindrical shield device according to the invention.
Figure 2:
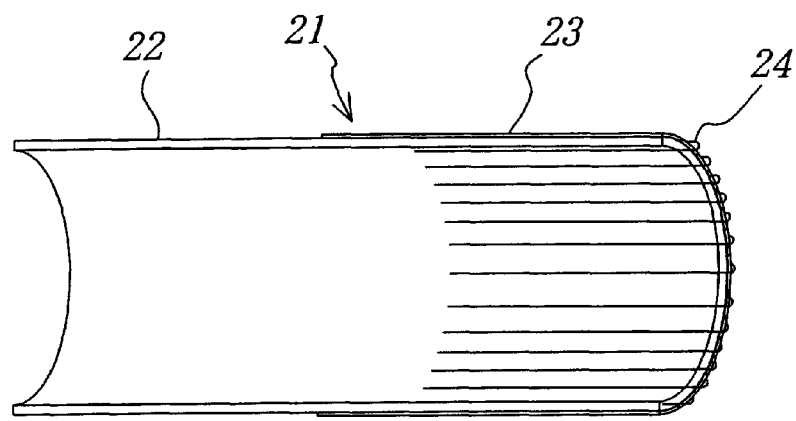
FIG. 2 is a schematic diagram illustrating the configuration of a second cylinder.
Figure 3:
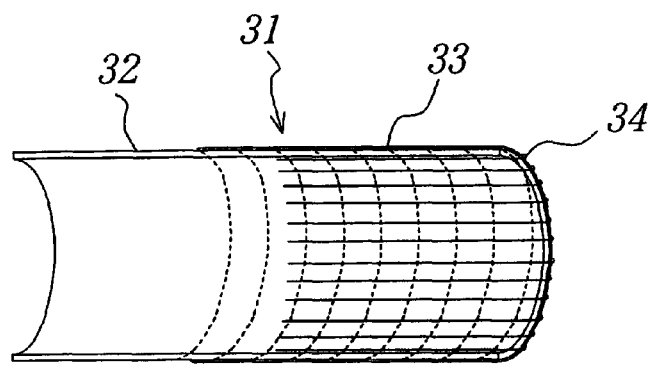
FIG. 3 is a schematic diagram depicting the construction of an innermost cylinder.

FIGS. 1–3 show cylinders constructing an embodiment of the open-ended cylindrical magnetic shield in accordance with the first aspect of the invention. In this embodiment, the three cylinders are arranged concentrically. FIGS. 1 and 2 show first outer cylinder 11 and second outer cylinder 21, respectively. These cylinders have a similar structure. The cylinders 11 and 21 are made of an electrical insulating non-magnetic material such as glass epoxy resin or hard plastics and are formed to have opened both ends. Around the cylinders 11 and 22, ribbons 13 and 23 made of a magnetic material of Metglass 2705M with a highly rectangular hysteresis loop are wound and fixed thereto such that the longitudinal direction of the ribbons is in parallel with the axial direction of the cylinders, and coils 14 and 24 are wound toroidally around the cylinders in order to perform the magnetic shaking enhancement. These magnetic ribbons 13 and 23 are made of amorphous and approximately 20 $\mu$m in thickness and 5 cm in width. In the present specification, the ribbon which is made of a magnetic material having a rectangular hysteresis loop is also called a rectangular magnetic ribbon.

FIG. 3 shows the innermost cylinder 31, which includes a cylinder 32 made of the same material as the cylinders 12 and 22, a rectangular magnetic ribbon 33 wound helically around the cylinder 32 and fixed thereto such that the ribbon casting direction is in parallel with the circumferential direction of the cylinder, and a coil 34 wound toroidally on the ribbon to perform the magnetic shaking enhancement.

Figure 4:
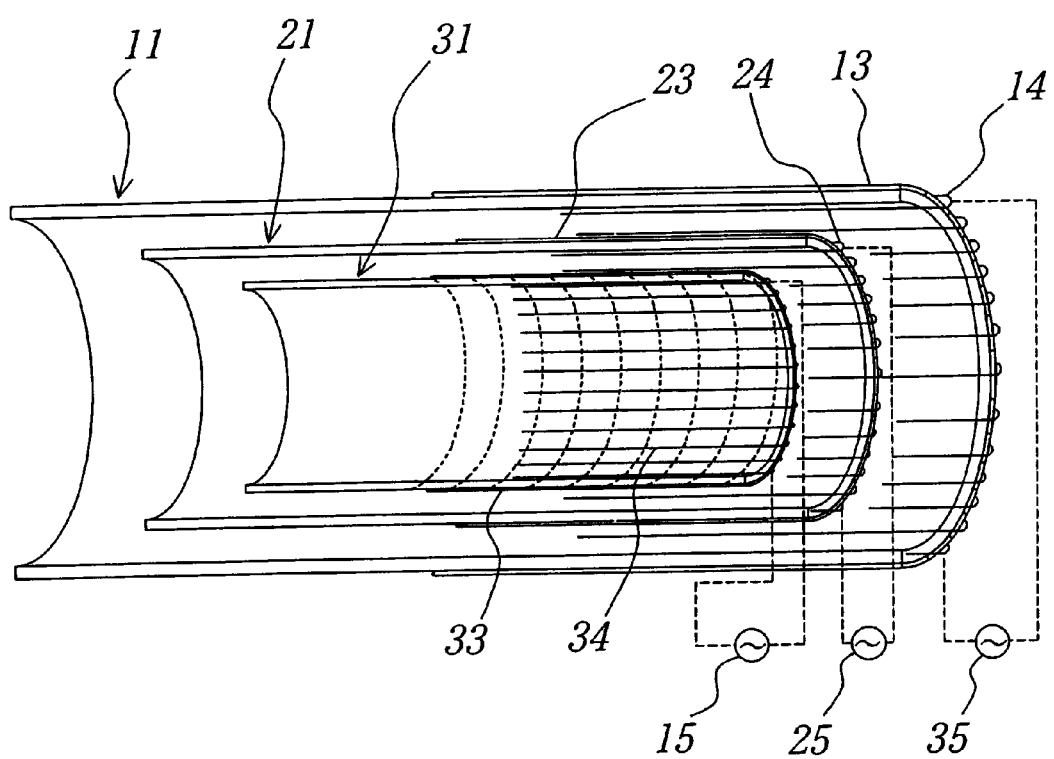
FIG. 4 is a schematic diagram illustrating the general configuration of an embodiment of the open-ended cylindrical shield device according to the first aspect of the invention, in which the three cylinders shown in FIGS. 1–3 are arranged concentrically.

FIG. 4 shows a magnetic shield device formed by arranging the above mentioned first cylinder 11, second cylinder 21 and third cylinder 31 concentrically, while a part of the cylinders are cut out. The second cylinder 21 is arranged concentrically within the first cylinder 11, and then the third cylinder 31 is placed concentrically within the second cylinder 21. Axial length of these cylinders 11, 21 and 31 becomes successively longer, and a desired magnetic shield space is obtained in an area in which these three cylinders are overlapped with one another. The coils 14, 24 and 34 wound around the first, second and third cylinders 11, 21 and 31, respectively are connected to alternating current power supply sources 15, 25 and 35, respectively to supply magnetic shaking currents having predetermined frequencies to these coils. Since a magnetic shaking current supplied for the innermost cylinder 31 having the circumferential structure in which the ribbon 33 is wound helically is about one tenth of that for both the first and second cylinders 11 and 21 having the axial structure in which the ribbons 13 and 23 are wound such that the ribbon casting direction is in parallel with the axial direction of the cylinders, a leakage of the magnetic shaking fields into the desired magnetic shield space can be highly suppressed.

In the above explained embodiment of the magnetic shield device, the circumferential structure for obtaining a large shielding factor on the transverse magnetic field is combined with the axial structure for attaining a large shielding factor on the axial magnetic field, and therefore the magnetic shielding factor on the transverse direction TSF (Transverse Shielding Factor) amounts to about 50000, while the magnetic shielding factor on the axial direction ASF (Axial Shielding Factor) is kept to about 20000, and magnetic fields from all directions can be effectively shielded. If all the first, second and third cylinders are formed to have the toroidal structure, a magnetic shielding factor on the transverse direction TSF would be only about 3600.

In the embodiment mentioned above, all the coils for supplying the magnetic shaking currents are wound toroidally, but according to the invention, all or a part of them may be wound helically. When the coil is wound helically, it is desired that the cylinder is made of an electrically conductive non-magnetic material such as aluminum and copper so that a magnetic flux generated by the coil does not spread inside the cylinder.

In addition, in the above mentioned embodiment, the three cylinders are arranged concentrically, but two, four or more cylinders may be arranged concentrically. When more than four cylinders are arranged, it is not always necessary to wind coils for supplying the magnetic shaking currents around all cylinders other than the innermost cylinder. However, it is desired to provide coils on all cylinders except for the innermost one.

Further, in the above embodiment, the three coils are connected to respective alternating current power supply sources, but according to the invention, these coils may be connected to a common alternating current power supply source. In case of providing different alternating current power supply sources, each magnetic shaking currents could be adjusted independently from one another, and therefore a higher magnetic shielding enhancement can be obtained.

In addition, in the embodiment mentioned above, the rectangular magnetic ribbon 33 is wound helically around the cylinder to construct the circumferential structure, and thus the longitudinal direction of the ribbon is inclined with respect to the circumferential direction of the cylinder. In this case, the inclination angle is preferably set to a value not larger than 40 degrees. The rectangular magnetic ribbon 33 may be fixed onto the surface of the cylinder such that the longitudinal direction of the ribbon is in parallel with the circumferential direction of the cylinder. Furthermore, in the above embodiment, the rectangular magnetic ribbons 13 and 23 are fixed such that the longitudinal direction of the ribbon is in parallel with the axial direction of the cylinder to construct the axial structure, but according to the invention, the rectangular magnetic ribbons 13 and 23 may be fixed such that the longitudinal direction of the ribbon is inclined with respect to the axial direction. In this case, the inclination angle is preferably set to a value not larger than 40 degrees.

As explained above, in the open-ended shell magnetic shield according to the first aspect of the invention, the cylinder having the ribbon made of a magnetic material with a rectangular hysteresis loop wound thereon to be in parallel with or substantially in parallel with the circumferential direction of the cylinder for attaining a large magnetic shielding enhancement on the transverse direction, is arranged as the innermost cylinder, and the cylinder having the ribbon made of a magnetic material with a rectangular hysteresis loop wound thereon to be in parallel with or substantially in parallel with the axial direction of the cylinder for obtaining a large magnetic shielding enhancement on the axial direction, is arranged outside the innermost cylinder, the high magnetic shielding enhancement for external magnetic fields from all directions can be obtained and an extremely high magnetic shielding factor S can be realized. In addition, since the magnetic shaking current for the innermost cylinder having the helical structure is about one tenth of that for the outer cylinders having the toroidal structure, a leakage of the magnetic shaking field into the inside of the cylinders is highly suppressed. Furthermore, a cylinder made of, for instance a PERMALLOY may be placed inside of the innermost cylinder when it is required to further reduce the leakage of the magnetic shaking magnetic field.

Figure 5:
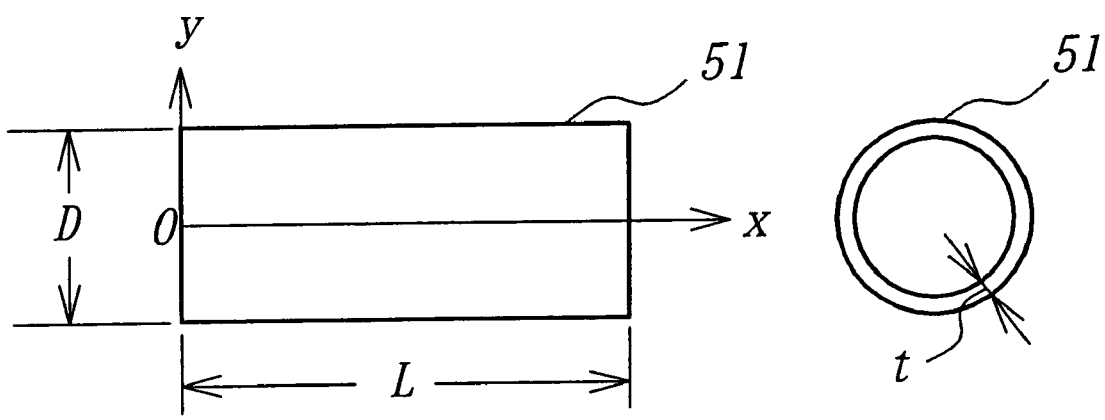
FIG. 5 is a schematic diagram depicting the construction of an embodiment of the open-ended cylindrical shield device according to the second aspect of the invention.

FIG. 5 shows a cylinder 51 for use in an embodiment of the open-ended cylindrical magnetic shield device according to the second aspect of the invention. The cylinder 51 is made of a magnetic material such as PERMALLOY. Now it is assumed that an axial length of the cylinder is L, a diameter is D, a thickness is t, and a relative permeability of the magnetic material of the cylinder is $\mu$. It is further assumed that the axial direction of the cylinder 51 is denoted by x, the transverse direction is denoted by y, and the point of origin is set on the center axis of the cylinder 51.

Figure 6:
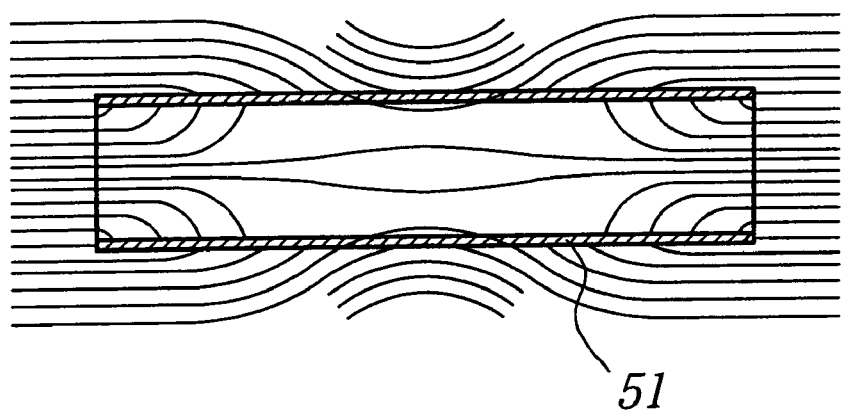
FIG. 6 is a schematic diagram showing magnetic flux distributions both inside and outside of the cylinder.

FIG. 6 shows qualitatively an operational principle for a magnetic field applied in the axial direction of the cylinder 51. A distribution of the magnetic field is represented by magnetic flux lines. The magnetic field has a characteristic that parallel magnetic flux lines repel each other to widen a space between the magnetic flux lines. Within a magnetic material having a high relative permeability $\mu$, the repelling force decreases in inverse proportion to the relative permeability $\mu$, and therefore many magnetic flux lines could be contained therein. As shown in FIG. 6, the magnetic flux lines which enter from the open-end of the cylinder 51 are drawn into the wall of the cylinder to form a zone in which the magnetic flux lines become small, and the magnetic flux lines in the vicinity of center are redistributed toward said zone in the vicinity of the wall. As a result, near the open-end of the cylinder, as illustrated in FIG. 6, the magnetic flux lines show a distribution in which the magnetic flux lines become smaller toward the middle of the cylinder and a spacing between magnetic flux lines is increased at the middle of the cylinder. This means that the magnetic flux density is reduced due to the magnetic shielding enhancement.

Magnetic flux lines locating near the outer wall of the cylinder are pressed by many magnetic flux lines locating in an more outside area of said magnetic flux lines and are drawn into the wall of the cylinder 51. Upon viewing the magnetic flux lines from the open-end of the cylinder 51 toward its middle zone along the outer wall of the cylinder, the magnetic flux lines are successively approaching to the cylinder and are drawn into the cylinder wall. In this manner, a relation between the magnetic flux lines and the cylinder 51 strongly depends on the axial length L. The magnetic flux lines are concentrated mostly in the vicinity of the middle zone of the cylinder, and if the axial length L of the cylinder is too long, the degree in the concentration might be increased, and therefore the magnetic flux lines could not be completely contained in the wall of the cylinder. Eventually the magnetic flux lines are leaked toward the inside of the cylinder. From this sort of things, it is easily understood that the axial length L has a special value which maximizes the magnetic shielding factor. A. Mager already has reported this in the article 'IEEE Trans. Magn.' Vol. 6, No. 1, 1970.

The inventors have further investigated the distribution of the magnetic flux lines within the cylinder, and have found that a uniform distribution of the magnetic flux lines viewed in the radial direction of the cylinder can be realized by adjusting a ratio of the axial length L to the diameter D of the cylinder. That is to say, the magnetic field entering into the cylinder from the open-end is dense on the axial line and is less dense near the inner wall of the cylinder. When the axial length L is long, a larger amount of the magnetic flux lines which have been taken into the wall of the cylinder 51 from outside is leaked out of the wall. Therefore, the distribution of the magnetic flux lines within the cylinder by the leakage is dense at the inner wall side of the cylinder and is decreased toward the axial line. In this way, the first distribution of the magnetic flux lines entering from the open-ends becomes opposite to the second distribution of the magnetic flux lines drawn into the outer wall of the cylinder. Furthermore, by suitably adjusting the ratio between the axial length L and the diameter D of the cylinder, the two distributions could be cancelled out, and the residual magnetic field within the shield on the transverse direction of the cylinder can be substantially uniform.

Figure 7:
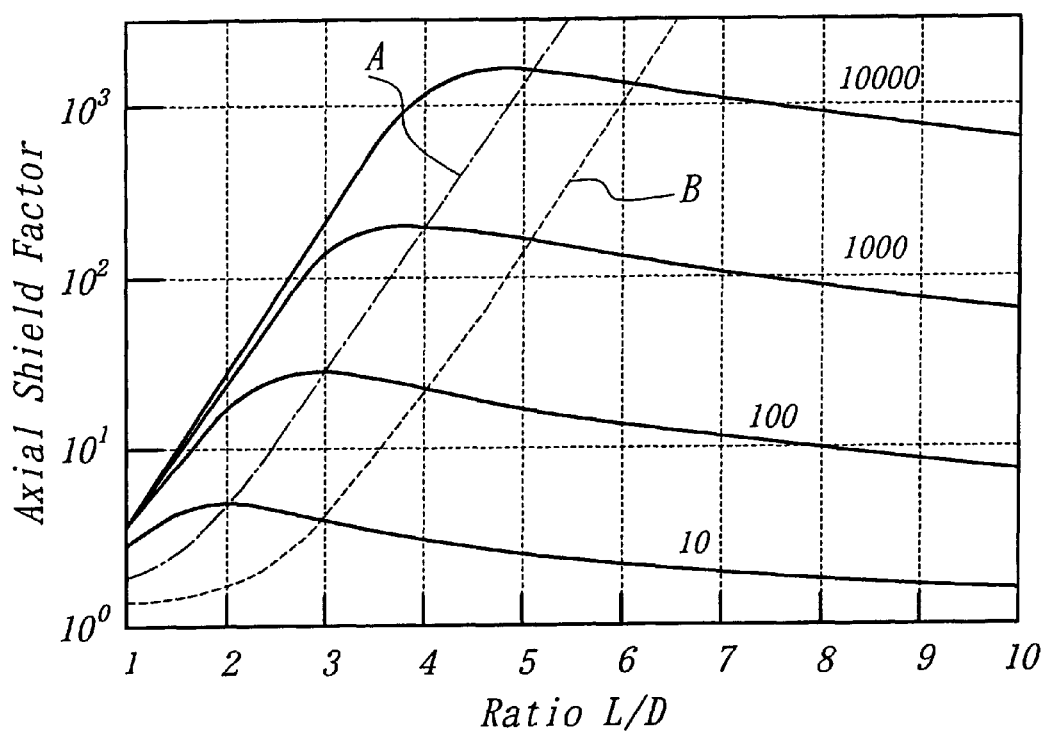
FIG. 7 is a graph representing a variation in the shielding factor in accordance with a ratio of a length and a diameter of the cylinder.

FIG. 7 shows a calculation result of the shielding factor on the axial direction at the central position of the cylinder in accordance with the finite element method, while the ratio (L/D) between the axial length L and the diameter D of the cylinder 51 is taken as an independent variable, and a value of a product of a relative permeability $\mu$ of a magnetic material consisting of the cylinder 51 and a thickness t of the wall normalized by the diameter D of the cylinder ($\mu t/D$) is taken as a parameter. At the beginning the shielding factor increases in accordance with an increase in L/D and reaches its peak value, and then decreases slowly. In the graph shown in FIG. 7, a chain line A represents peak values of the shielding factor when the parameter $\mu t/D$ is varied. Also, in FIG. 7, a broken line B denotes positions at which the distribution of the residual magnetic field within the shield on the transverse direction of the cylinder shows the best uniformity when the parameter $\mu t/D$ is varied. This residual magnetic field distribution on the transverse direction is computed using the finite element method at the central position of the shield. Upon comparing these curves A and B, it is understood that the L/D values for attaining the best uniformity of the residual magnetic field are somewhat larger than the L/D values for obtaining the maximum shielding factor.

In FIG. 7, the ratio between the axial length and the diameter of the cylinder 51 for attaining the maximum shielding factor on the axial direction is given by the following equation.

$$L/D = 1 + \log(\mu t/D) \tag{1}$$

Although this equation (1) is very simplified, the value given by the equation is approximately coincided with a value given by a complex approximate analysis equation proposed by A. Mager in the above mentioned IEEE Trans. Magn. Vol. 6, No. 1, 1970. In the present invention, the inventors have found from FIG. 7 that the uniform distribution of the residual magnetic field within the shield as well as the sufficiently high shielding factor can be obtained by setting the ratio between the axial length L and the diameter D of the cylinder in accordance with the following equation (2), wherein C is a constant within a range from 0.5 to 1.2:

$$L/D = 1 + \log(\mu t/D) + C \tag{2}$$

According to the invention, C is set to a value within a range from 0.5 to 1.2 owing to the above described reason. That is to say, a deviation from the maximum shielding factor can be suppressed, and at the same time the residual magnetic field within the shield on the transverse direction of the cylinder can be uniform. It should be noted that such functions can be remarkably attained when the constant C is set to a value within a range from 0.75 to 1.0.

Figure 8:
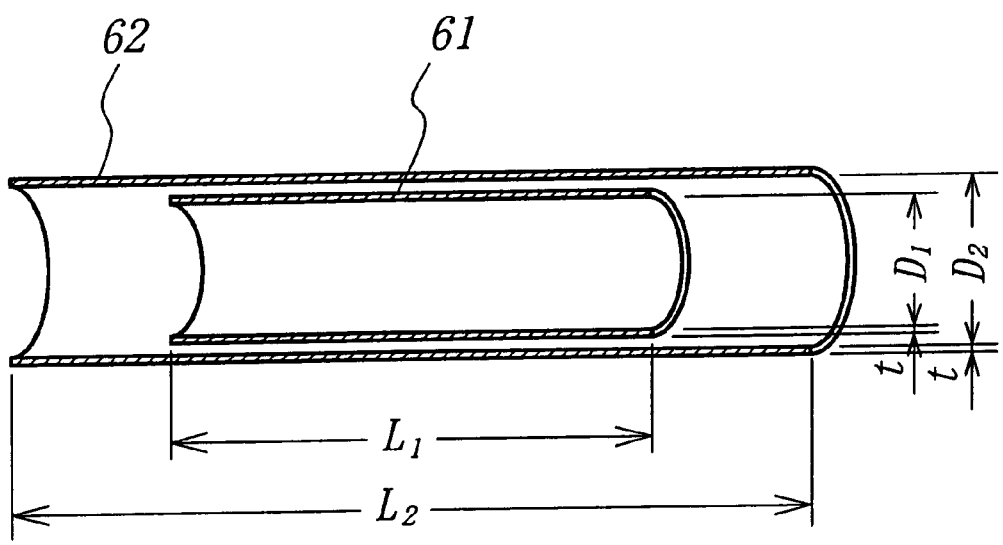
FIG. 8 is a schematic diagram illustrating the configuration of an embodiment of the open-ended cylindrical shield device comprising two cylinders according to the third aspect of the invention.

FIG. 8 shows an embodiment of the magnetic field shield device according to the third aspect of the invention. In this embodiment, a first cylinder 61 and a second cylinder 62 are arranged concentrically. Axial length of these first and second cylinders 61 and 62 is denoted by $L_1$ and $L_2$, diameter by $D_1$ and $D_2$, thickness by $t_1$ and $t_2$, and relative permeability of the magnetic materials composing the cylinders is denoted by $\mu_1$ and $\mu_2$, respectively. In this embodiment, the two cylinders 61 and 62 have the same thickness ($t_1=t_2$) and are made of the same magnetic material ($\mu_1=\mu_2$).

According to the third aspect of the invention, the first and second cylinders 61 and 62 are configured such that gradients of residual magnetic fields within these first and second cylinders have opposite signs, and the residual magnetic field within the shield can be uniform. That is to say, a ratio ($L_1/D_1$) of the axial length $L_1$ to the diameter $D_1$ of the first cylinder 61 and a ratio ($L_2/D_2$) of the axial length $L_2$ to diameter $D_2$ of the second cylinder 62 are selected from both sides of the broken curve B in FIG. 7 such that the uniformity of the residual magnetic field within the shield can be assured. For instance, when a ratio $L_1/D_1$ of the axial length to the diameter of the first cylinder 61 is selected from the right side region of the curve B, a ratio of the axial length to the diameter of the first cylinder 62 $L_1/D_1$ is selected from the left side region of the curve B.

Figure 9A:
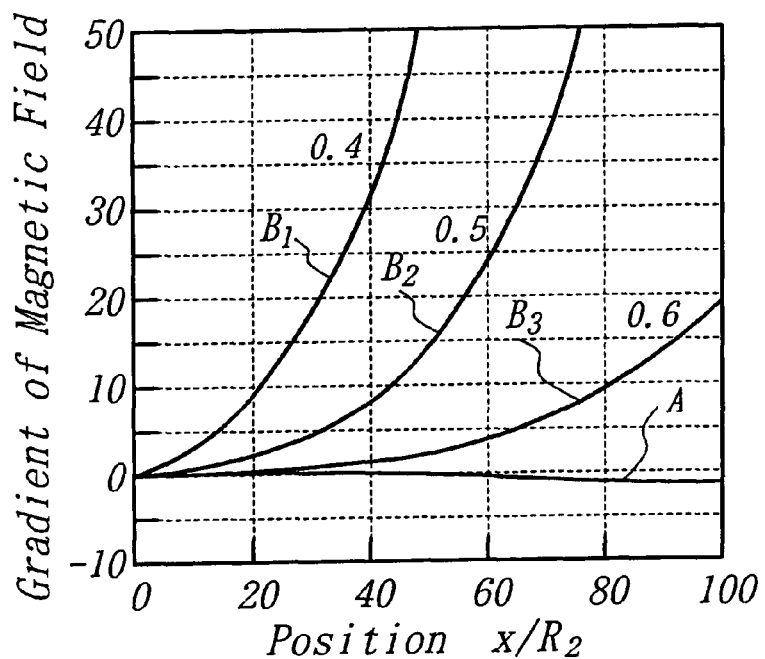
FIGS. 9A–9D are graphs showing distributions of residual magnetic fields within the shield in the transverse direction and axial direction, while a ratio of axial lengths of the two cylinders is taken as a parameter.
Figure 9B:
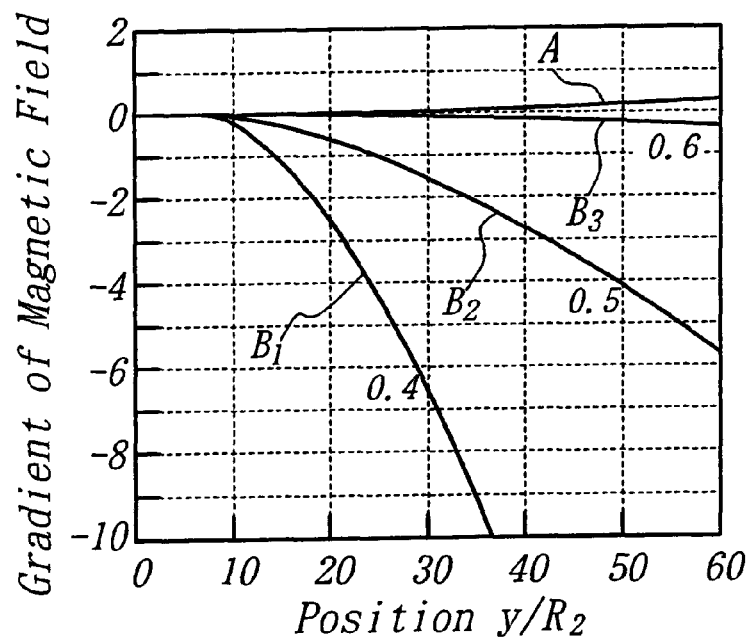

FIGS. 9A and 9B show gradients of magnetic field distributions on the axial direction x and transverse direction y, respectively, when the axial length $L_1$ of the first inner cylinder 61 is varied with respect to the axial length $L_2$ of the outer second cylinder 62. In these graphs, curves A show the gradients of the magnetic field distribution within the outer second cylinder 62. When the ratio ($L_1/L_2$) of the axial length $L_2$ of the outer second cylinder 62 to the axial length $L_1$ of the inner first cylinder 61 is changed to values such as 0.4, 0.5 and 0.6, the gradient of the residual magnetic field distribution within the shield changes such that the gradient of the magnetic field distribution on the axial direction within the inner first cylinder 61 shown in FIG. 9A has a positive sign, and the gradient of the magnetic field distribution within outer second cylinder has a negative sign.

Figure 9C:
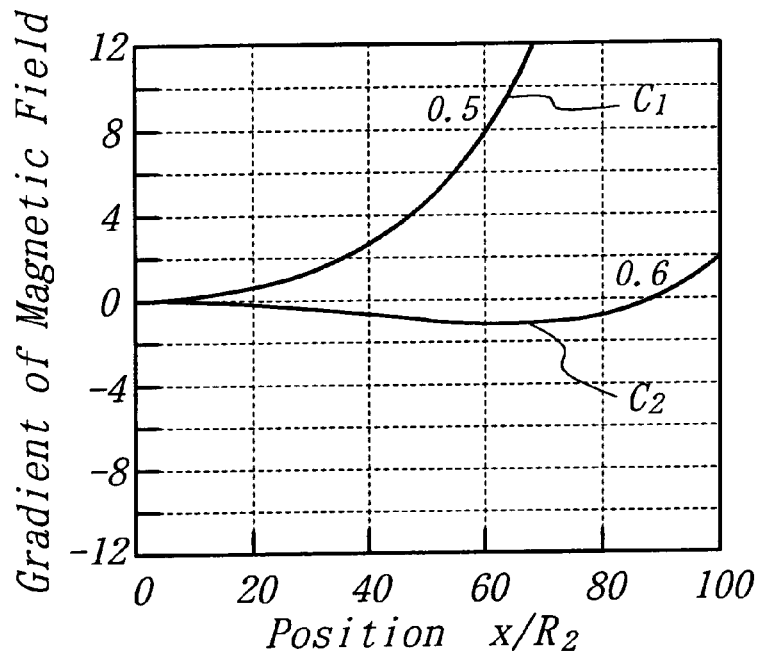

FIG. 9C shows a gradients of a composite magnetic field distribution on the axial direction when the first and second cylinders 61 and 62 are arranged concentrically. Curves $C_1$ and $C_2$ represent gradients when the ratio ($L_1/L_2$) of the axial length $L_1$ of the first cylinder 61 to the axial length $L_2$ of the second cylinder 62 are set 0.5 and 0.6, respectively. As can be understood from this graph, the gradient of the magnetic field distribution on the axial direction could be substantially zero by setting the ratio $L_1/L_2$ to a value in the vicinity of 0.6.

Figure 9D:
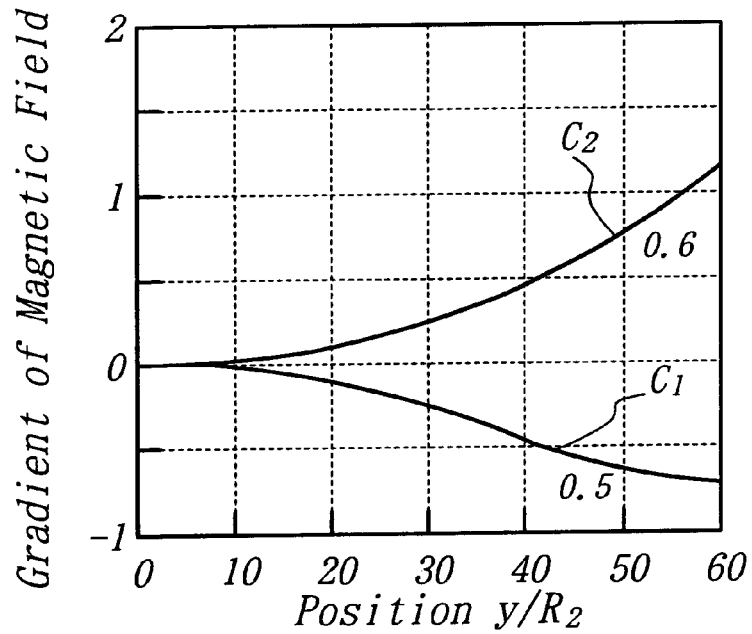

FIG. 9D shows a gradient of a composite magnetic field distribution on the transverse direction when the first and second cylinders 61 and 62 are arranged concentrically. Curves $C_1$ and $C_2$ represent gradients when the ratio ($L_1/L_2$) of the axial length $L_1$ of the first cylinder 61 to the axial length $L_2$ of the second cylinder 62 are set to 0.5 and 0.6, respectively. As is apparent from this graph, the gradient of the magnetic field distribution on the axial direction could be substantially zero by adjusting the ratio $L_1/L_2$ to a value within a range from 0.5 to 0.6. That is to say, the gradient of the magnetic field on the radial direction can be substantially zero by setting said ratio to a value in the vicinity of 0.5.

In this way, according to the third aspect of the invention, the gradient of the magnetic field distribution on the axial direction or on the transverse direction or on both the axial and transverse direction could be substantially zero by suitably adjusting the ratio $L_1/L_2$ of the axial length of the cylinder 61 and the cylinder 62 which are arranged concentrically and the uniformity of the residual magnetic field within the shield can be realized. In this case, whether the uniformity of the residual magnetic field within the shield is realized on the axial direction or on the transverse direction or on both the axial and transverse directions could be suitably selected according to particular applications.

In the above mentioned embodiment shown in FIG. 8, the two cylinders are arranged concentrically to construct the double cylinder structure, but according to the invention more than two cylinders could be arranged concentrically. In this case, one or more inner cylinders may be selected as a first group and one or more outer cylinders may be selected as a second group. Even if any group configuration is selected, the axial length of the cylinders is successively longer toward the outer cylinders. In any cases, of course, the uniformity of the magnetic field distribution on the transverse and axial directions is obtained only in a region in which all the cylinders are superimposed one another.

What is claimed is:

1. An open-ended cylindrical magnetic shield device including at least two open-ended cylinders which are arranged concentrically, a magnetic shaking being applied to each of said cylinders wherein;

a ribbon made of a magnetic material having a rectangular hysteresis loop is fixed on an innermost cylinder such that a longitudinal direction of the ribbon is in parallel with or substantially in parallel with a circumferential direction of the cylinder to obtain a large magnetic shielding enhancement on a transverse direction;

a coil is wound around the innermost cylinder, a magnetic shaking current being supplied to said coil;

a ribbon made of a magnetic material having a rectangular hysteresis loop is fixed on at least one cylinder other than said innermost cylinder such that a longitudinal direction of the ribbon is in parallel with or substantially in parallel with an axial direction of the cylinder such that a large magnetic shielding enhancement is obtained on the axial direction; and a coil is wound around said at least one cylinder, a magnetic shaking current being supplied to said at least one cylinder.

2. The open-ended cylindrical magnetic shield device according to claim 1, wherein first, second and third cylinders having the magnetic shaking applied thereto, are arranged concentrically, a ribbon made of an amorphous magnetic material with a rectangular hysteresis loop is wound on the third innermost cylinder such that the longitudinal direction of the ribbon is substantially in parallel with or in parallel with the circumference direction of the cylinder, and a ribbon made of an amorphous magnetic material with a rectangular hysteresis loop is fixed on each of the first and second cylinders arranged outside the third cylinder such that the longitudinal direction of the ribbon is substantially in parallel with or in parallel with the axial direction of the cylinder.

3. The open-ended cylindrical magnetic shield device according to claim 2, wherein the ribbon made of a magnetic material with a rectangular hysteresis loop is helically wound and fixed around the innermost third cylinder.

4. The open-ended cylindrical magnetic shield device according to claim 1, wherein each of said coils to which the magnetic shaking current is supplied is toroidally wound around the cylinder.

5. The open-ended cylindrical magnetic shield device according to claim 1, wherein each of said coils to which the magnetic shaking current is supplied is helically wound around the cylinder.

6. The open-ended cylindrical magnetic shield device according to claim 5, wherein each of said cylinders to which the magnetic shaking is applied is made of a non-magnetic and electrically conductive material.

7. The open-ended cylindrical magnetic shield device according to claim 1, wherein said cylinders are successively shortened toward the innermost cylinder.

8. The open-ended cylindrical magnetic shield device according to claim 1, wherein among a plurality of cylinders having the magnetic shaking applied thereto, the ribbon made of a magnetic material having a rectangular hysteresis loop is fixed around the innermost cylinder such that the ribbon casting direction is inclined with respect to the circumferential direction of the cylinder by an angle not larger than 40 degrees, and the ribbon made of a magnetic material having a rectangular hysteresis loop is fixed around said at least one cylinder other than the innermost cylinder such that the ribbon casting direction is inclined with respect to the axial direction of the cylinder by an angle not larger than 40 degrees.

9. The open-ended cylindrical magnetic shield device according to claim 1, wherein an open-ended cylinder having no magnetic shaking applied thereto is arranged within the innermost cylinder among a plurality of cylinders having the magnetic shaking applied thereto.

10. The open-ended cylindrical magnetic shield device according to claim 9, wherein said open-ended cylinder having no magnetic shaking applied thereto is made of a Ni—Fe magnetic material.

11. An open-ended cylindrical magnetic shield device comprising a single open-ended cylinder made of a magnetic material, said cylinder being constructed to satisfy the following equation:

$$L/D = 1 + \log(\mu t/D) + C$$

wherein L is an axial length, D is a diameter and t is a thickness of said cylinder, $\mu$ is a relative permeability of the magnetic material of the cylinder, and C is a constant within a range from 0.5 to 1.2.

12. The open-ended cylindrical magnetic shield device according to claim 11, wherein the constant C is set to a value within a range from 0.75 to 1.0.

13. An open-ended cylindrical magnetic shield device including a plurality of open-ended cylinders made of magnetic materials and arranged concentrically, wherein said cylinders are divided into first and second groups such that a sign of axial and/or radial gradients of magnetic fields within one or more cylinders belonging to the first group is opposite to a sign of axial and/or radial gradients of magnetic fields within one or more cylinders belonging to the second group, and a ratio between length L and diameter D of these cylinders are set such that a magnitude of a gradient of composed magnetic fields in the first group becomes substantially identical with a magnitude of a gradient of composed magnetic fields in the second group.

14. The open-ended cylindrical magnetic shield device according to claim 13, wherein first and second cylinders arranged concentrically are made of a same magnetic material to have a same thickness.

* * * * *